(12) United States Patent
Yang

(10) Patent No.: US 10,541,199 B2
(45) Date of Patent: Jan. 21, 2020

(54) BEOL INTEGRATION WITH ADVANCED INTERCONNECTS

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/826,393

(22) Filed: Nov. 29, 2017

(65) Prior Publication Data

US 2019/0164885 A1    May 30, 2019

(51) Int. Cl.
| | |
|---|---|
| *H01L 23/522* | (2006.01) |
| *H01L 23/532* | (2006.01) |
| *H01L 23/528* | (2006.01) |
| *H01L 21/768* | (2006.01) |

(52) U.S. Cl.
CPC ...... *H01L 23/5226* (2013.01); *H01L 21/7684* (2013.01); *H01L 21/76846* (2013.01); *H01L 21/76882* (2013.01); *H01L 23/5283* (2013.01); *H01L 21/76858* (2013.01); *H01L 23/53209* (2013.01); *H01L 23/53219* (2013.01); *H01L 23/53223* (2013.01); *H01L 23/53233* (2013.01); *H01L 23/53238* (2013.01); *H01L 23/53247* (2013.01); *H01L 23/53252* (2013.01); *H01L 23/53261* (2013.01); *H01L 23/53266* (2013.01); *H01L 23/53295* (2013.01)

(58) Field of Classification Search
CPC ......... H01L 23/5226; H01L 23/53204–53266; H01L 23/53233; H01L 2221/1015; H01L 2221/1073; H01L 2221/1084; H01L 2221/1089
See application file for complete search history.

(56) References Cited

U.S. PATENT DOCUMENTS

| | | |
|---|---|---|
| 6,204,179 B1 | 3/2001 | McTeer |
| 6,599,828 B1 | 7/2003 | Gardner |
| 6,830,998 B1 | 12/2004 | Pan et al. |
| 6,861,350 B1 | 3/2005 | Ngo et al. |
| 7,060,571 B1 | 6/2006 | Ngo et al. |
| 7,071,086 B2 | 7/2006 | Woo et al. |
| 7,091,118 B1 | 8/2006 | Pan et al. |
| 7,138,323 B2 | 11/2006 | Kavalieros et al. |
| 7,217,611 B2 | 5/2007 | Kavalieros et al. |

(Continued)

*Primary Examiner* — Thanhha S Pham
(74) *Attorney, Agent, or Firm* — Scully, Scott, Murphy & Presser, P.C.; Alvin Borromeo, Esq.

(57) ABSTRACT

An alloy liner is located on a diffusion barrier liner and both are present in at least a via portion of a combined via/line opening that is present in an interconnect dielectric material. The alloy liner includes an alloy of a first metal or metal alloy having a first bulk resistivity and a second metal or metal alloy having a second bulk resistivity that is higher than the first bulk resistivity. A first electrically conductive structure is located on the alloy liner and is present in at least the via portion of the combined via/line opening. The first electrically conductive structure includes the second metal or metal alloy. A second electrically conductive structure can be present in at least the line portion of the combined via/line opening. The second electrically conductive structure may include a metal or metal alloy having the first or second bulk resistivity.

15 Claims, 4 Drawing Sheets

(56) References Cited

U.S. PATENT DOCUMENTS

| | | |
|---|---|---|
| 7,271,045 B2 | 9/2007 | Prince et al. |
| 7,365,015 B2 | 4/2008 | Lin et al. |
| 7,422,936 B2 | 9/2008 | Barns et al. |
| 7,569,443 B2 | 8/2009 | Kavalieros et al. |
| 7,663,237 B2 | 2/2010 | Peng et al. |
| 7,667,278 B2 | 2/2010 | Cabral, Jr. et al. |
| 7,718,479 B2 | 5/2010 | Kavalieros et al. |
| 7,754,552 B2 | 7/2010 | Barns et al. |
| 8,796,853 B2 | 8/2014 | Yang et al. |
| 9,514,983 B2 | 12/2016 | Jezewski et al. |
| 9,646,931 B1 | 5/2017 | Edelstein et al. |
| 9,716,063 B1 | 7/2017 | Edelstein et al. |
| 9,728,399 B1 | 8/2017 | Edelstein et al. |
| 2007/0132100 A1* | 6/2007 | Ikeda .................. C23C 14/027 |
| | | 257/751 |
| 2007/0148944 A1 | 6/2007 | Lee |
| 2009/0169760 A1 | 7/2009 | Akolkar et al. |
| 2010/0078815 A1 | 4/2010 | Wang et al. |
| 2014/0220777 A1 | 8/2014 | Yang et al. |
| 2015/0179579 A1 | 6/2015 | Jezewski et al. |
| 2015/0203961 A1 | 7/2015 | Ha et al. |
| 2017/0170062 A1 | 6/2017 | Murray et al. |

* cited by examiner

BEOL INTEGRATION WITH ADVANCED INTERCONNECTS

BACKGROUND

The present application relates to back-end-of-the-line (BEOL) semiconductor technology. More particularly, the present application relates to BEOL interconnect structures that exhibit controlled via resistance and, in some instances, controlled line resistance and methods of forming the same.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring, i.e., interconnect, structures.

Within typical dual damascene interconnect structures, electrically conductive metal vias run perpendicular to the semiconductor substrate and electrically conductive metal lines run parallel to the semiconductor substrate. Typically, the electrically conductive metal vias are present beneath the electrically conductive metal lines and both features are embedded within an interconnect dielectric material layer.

In conventional dual damascene interconnect structures, copper or a copper containing alloy has been used as the material of the electrically conductive metal vias and lines. In recent years, advanced dual damascene interconnect structures containing a combined electrically conductive via/line feature have been developed in which an alternative metal such as cobalt or ruthenium has been used instead of copper or a copper alloy in the electrically conductive via only, or in both the electrically conductive via and electrically conductive line. While the use of such alternative metals in the via can provide enhanced electromigration resistance, such advanced dual damascene structures exhibit a significant via resistance increase.

There is thus a need for providing advanced dual damascene interconnect structures in which an electrically conductive via has a controlled via resistance, and, in some instances, an electrically conductive line that also has a controlled metal line resistance.

SUMMARY

The present application provides semiconductor structures, i.e., BEOL structures, that exhibit controlled via resistance and, in some instances, controlled line resistance. In one embodiment, the semiconductor structure includes an interconnect level including an interconnect dielectric material layer having a combined via/line opening located therein. A diffusion barrier liner is located in at least a via portion of the combined via/line opening. An alloy liner is located on the diffusion barrier liner and is present in at least the via portion of the combined via/line opening. The alloy liner includes a combination, i.e., an alloy, of a first metal or metal alloy having a first bulk resistivity and a second metal or metal alloy having a second bulk resistivity that is higher than the first bulk resistivity. A first electrically conductive structure is located on the alloy liner and is present in at least the via portion of the combined via/line opening. The first electrically conductive structure includes the second metal or metal alloy having the second bulk resistivity. In some embodiments, a second electrically conductive structure is present in at least a line portion of the combined via/line opening. The second electrically conductive structure may include a metal or metal alloy having either the first bulk resistivity or the second bulk resistivity.

In another embodiment, the semiconductor structure includes an interconnect level including an interconnect dielectric material layer having a combined via/line opening located therein. A diffusion barrier liner is located in at least a via portion of the combined via/line opening. A first electrically conductive structure is located on the diffusion barrier liner and is present in at least the via portion of the combined via/line opening. The first electrically conductive structure includes a combination, i.e., an alloy, of a first metal or metal alloy having a first bulk resistivity and a second metal or metal alloy having a second bulk resistivity that is higher than the first bulk resistivity. In some embodiments, a second electrically conductive structure is present in at least a line portion of the combined via/line opening. The second electrically conductive structure may include a metal or metal alloy having either the first bulk resistivity or the second bulk resistivity.

The present application also provides methods of forming semiconductor structures, i.e., BEOL structures, that exhibit controlled via resistance and, in some instances, controlled line resistance. In one embodiment, the method includes providing an interconnect level including an interconnect dielectric material layer having a combined via/line opening located therein. A diffusion barrier layer is then formed in the combined via/line opening, and thereafter a reflow enhancement layer is formed on the diffusion barrier layer. The reflow enhancement layer is composed of a metal or metal alloy having a first bulk resistivity. A first metal or metal alloy layer is then formed on the reflow enhancement layer. The first metal or metal alloy layer is composed of a metal or metal alloy having a second bulk resistivity that is higher than the first bulk resistivity. A reflow anneal is then performed to convert the reflow enhancement layer into an alloy liner, and to reflow the first metal or metal alloy layer into at least a via portion of the combined via/line opening.

In another embodiment, the method includes providing an interconnect level including an interconnect dielectric material layer having a combined via/line opening located therein. A diffusion barrier layer is then formed in the combined via/line opening, and thereafter a reflow enhancement layer is formed on the diffusion barrier layer. The reflow enhancement layer is composed of a metal or metal alloy having a first bulk resistivity. A first metal or metal alloy layer is then formed on the reflow enhancement layer. The first metal or metal alloy layer is composed of a metal or metal alloy having a second bulk resistivity that is higher than the first bulk resistivity. A reflow anneal is then performed to convert the reflow enhancement layer and the first metal or metal alloy layer into an electrically conductive layer that is composed of an alloy of the metal or metal alloy having the first bulk resistivity and the metal or metal alloy having the second bulk resistivity.

DETAILED DESCRIPTION

Figure 1:
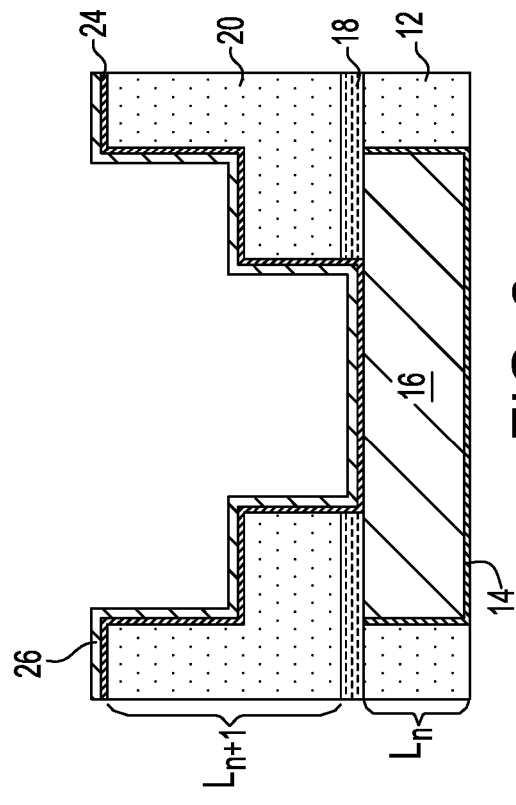
FIG. 1 is a cross sectional view of an exemplary semiconductor structure during an early stage of fabrication and including a second interconnect dielectric material layer having a combined via/line opening formed therein and located above a lower interconnect level in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Advanced interconnect structures are provided that exhibit controlled via resistance and, in some embodiments, a controlled line resistance. By "controlled via resistance", it is meant a resistance of less than 100 ohm/via. By "controlled line resistance", it is meant a resistance of less than 1000 ohm/line.

Referring first to FIGS. 1-11, there are illustrated various processing steps that provide a semiconductor structure in accordance with a first embodiment of the present application. In FIGS. 1-11, there are shown processing steps that provide semiconductor structures that include an interconnect level, $L_{n+1}$, including an interconnect dielectric material layer 20 having a combined via/line opening 22 located therein. A diffusion barrier liner 24L is located in at least the via portion of the combined via/line opening 22. An alloy liner 30L is located on the diffusion barrier liner 24L and is present in at least the via portion of the combined via/line opening 22. The alloy liner 30L includes a combination, i.e., alloy, of a first metal or metal alloy having a first bulk resistivity and a second metal or metal alloy having a second bulk resistivity that is higher than the first bulk resistivity. A first electrically conductive structure 28S is located on the alloy liner 30L and is present in at least the via portion of the combined via/line opening 22. The first electrically conductive structure 28S includes the second metal or metal alloy having the second bulk resistivity. In some embodiments, a second electrically conductive structure 32S is present in at least the line portion of the combined via/line opening 22. The second electrically conductive structure 32S may include a metal or metal alloy having either the first bulk resistivity or the second bulk resistivity.

Referring first to FIG. 1, there is illustrated an exemplary semiconductor structure during an early stage of fabrication in accordance with an embodiment of the present application. As is shown, the exemplary semiconductor structure of FIG. 1 includes a second interconnect dielectric material layer 20 having a combined via/line opening 22 formed therein and located above a lower interconnect level, $L_n$. The second interconnect dielectric material layer 20 is a component of an upper interconnect level, $L_{n+1}$, wherein n is 0 or an integer starting from 1. When n is 0, the lower interconnect level, $L_n$, is omitted and replaced with a semiconductor substrate that contains a plurality of semiconductor devices formed therein or thereupon.

When present, the lower interconnect level, $L_n$, includes a first interconnect dielectric material layer 12 that includes at least one metal-containing structure 16 embedded therein; the at least one metal-containing structure is electrically conductive. A first diffusion barrier liner 14 is also present that surrounds the sidewalls and the bottom wall (i.e., bottommost surface) of the at least one metal-containing structure 16 which is embedded in the first interconnect dielectric material layer 12. As is shown, the metal-containing structure 16 and the first diffusion barrier liner 14 have topmost surfaces that are coplanar with each other as well as coplanar with a topmost surface of the first interconnect dielectric material layer 12. In some embodiments, the first diffusion barrier liner 14 may be omitted from the lower interconnect level, $L_n$. In some embodiments, the first interconnect dielectric material layer 12 may extend beneath the at least one metal-containing structure 16 so as to completely embed the at least one metal-containing structure 16.

The first interconnect dielectric material layer 12 of the lower interconnect level, $L_n$, may be composed of an inorganic dielectric material or an organic dielectric material. In some embodiments, the first interconnect dielectric material layer 12 may be porous. In other embodiments, the first interconnect dielectric material layer 12 may be non-porous. Examples of suitable dielectric materials that may be employed as the first interconnect dielectric material layer 12 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The first interconnect dielectric material layer 12 may have a dielectric constant (all dielectric constants mentioned herein are measured relative to a vacuum, unless otherwise stated) that is about 4.0 or less. In one embodiment, the first interconnect dielectric material layer 12 has a dielectric constant of 2.8 or less. These dielectrics generally having a lower parasitic cross talk as compared to dielectric materials whose dielectric constant is greater than 4.0.

The first interconnect dielectric material layer 12 may be formed by a deposition process such as, for example, chemical vapor deposition (CVD), plasma enhanced chemical vapor deposition (PECVD) or spin-on coating. The first interconnect dielectric material layer 12 may have a thickness from 50 nm to 250 nm. Other thicknesses that are lesser than 50 nm, and greater than 250 nm can also be employed in the present application.

After providing the first interconnect dielectric material layer 12, at least one opening (not shown) is formed into the first interconnect dielectric material layer 12; each opening will house the metal-containing structure 16 and, if present, the first diffusion barrier liner 14. The at least one opening in the first interconnect dielectric material layer 12 may be a via opening, a line opening and/or combined a via/lines opening. The at least one opening may be formed by lithography and etching. In embodiments in which a combined via/line opening is formed, a second iteration of lithography and etching may be used to form such an opening.

In some embodiments, a first diffusion barrier material is then formed within the at least one opening and on an exposed topmost surface of the first interconnect dielectric material layer 12; the first diffusion barrier material will provide the first diffusion barrier liner 14 mentioned above. The first diffusion barrier material may include Ta, TaN, Ti, TiN, Ru, RuN, RuTa, RuTaN, W, WN or any other material that can serve as a barrier to prevent a conductive material from diffusing there through. The thickness of the first diffusion barrier material may vary depending on the deposition process used as well as the material employed. In some embodiments, the first diffusion barrier material may have a thickness from 2 nm to 50 nm; although other thicknesses for the diffusion barrier material are contemplated and can be employed in the present application as long as the first diffusion barrier material does not entirely fill the opening. The first diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the first diffusion barrier material. In cases in which the conductive material to be subsequently and directly formed on the first diffusion barrier material, the optional plating seed layer is not needed. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

An interconnect metal or metal alloy is formed into each opening and, if present, atop the first diffusion barrier material. The interconnect metal or metal alloy provides the metal-containing structure 16 of the present application. The interconnect metal or metal alloy may be composed of copper (Cu), aluminum (Al), tungsten (W), or an alloy thereof such as, for example, a Cu—Al alloy. The interconnect metal or metal alloy can be formed utilizing a deposition process such as, for example, CVD, PECVD, sputtering, chemical solution deposition or plating. In one embodiment, a bottom-up plating process is employed in forming the interconnect metal or metal alloy. In some embodiments, the interconnect metal or metal alloy is formed above the topmost surface of the first interconnect dielectric material layer 12.

Following the deposition of the interconnect metal or metal alloy, a planarization process such as, for example, chemical mechanical polishing (CMP) and/or grinding, can be used to remove all interconnect metal or metal alloy (i.e., overburden material) that is present outside each of the openings forming the metal-containing structure 16 shown in FIG. 1. The planarization stops on a topmost surface of the first interconnect dielectric material layer 12. Thus, and if present, the planarization process also removes the first diffusion barrier material from the topmost surface of the first interconnect dielectric material layer 12. The remaining portion of the first diffusion barrier material that is present in the at least one opening is referred to herein as the first diffusion barrier liner 14, while the remaining interconnect metal or metal alloy that is present in the at least one opening may be referred to as the metal-containing structure 16. Collectively, the first interconnect dielectric material layer 12, each optional first diffusion barrier liner 14, and each metal-containing structure 16 define the lower interconnect level, $L_n$, of an interconnect structure of the present application.

In some embodiments, capping layer 18 can be formed on the physically exposed topmost surface of the lower interconnect level, $L_n$, of the present application. In some embodiments, capping layer 18 can be omitted. When present, the capping layer 18 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The capping material that provides the capping layer 18 may be formed utilizing a deposition process such as, for example, CVD, PECVD, ALD, chemical solution deposition or evaporation. When present, capping layer 18 may have a thickness from 10 nm to 100 nm. Other thicknesses that are lesser than 10 nm, or greater than 100 nm may also be used as the thickness of the capping layer 18.

The second interconnect dielectric material layer 20 (without the combined via/line opening) is then formed above the lower interconnect level, $L_n$. The second interconnect dielectric material layer 20 may include one of the interconnect dielectric materials mentioned above for the first interconnect dielectric material layer 12. In some embodiments, the second interconnect dielectric material layer 20 includes a same interconnect dielectric material as the first interconnect dielectric material layer 12. In other embodiments, the second interconnect dielectric material layer 20 includes a different interconnect dielectric material than the first interconnect dielectric layer 12. The second interconnect dielectric material layer 20 may be porous or non-porous, have a thickness within the thickness range of the first interconnect dielectric material layer 12, and be formed utilizing one of the deposition processes used in providing the first interconnect dielectric material layer 12.

A combined via/line opening 22 (opening 22 can also be referred to herein as a dual damascene opening) can be formed into the second interconnect dielectric material layer 20. During or, after, the formation of the via portion of the combined via opening 22, the capping layer 18 can be opened as is shown in FIG. 1 to expose a portion of the topmost surface of the at least one metal-containing structure 16. In embodiments in which n is 0, the via portion of the combined via/line opening 22 can physically expose a conductive material or conductive region of one of the semiconductor devices that is formed upon or within a semiconductor substrate. The combined via/line opening 22 is formed utilizing a dual damascene process as known in the art. As is shown in FIG. 1, the line portion of the combined via/line opening 22 is located above the via portion of the combined via/line opening 22.

Figure 2:
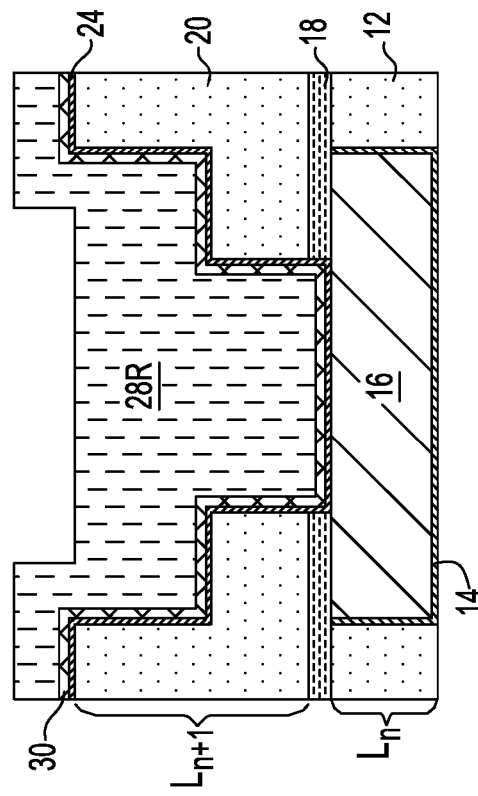
FIG. 2 is a cross sectional view of the exemplary semiconductor structure of FIG. 1 after forming a diffusion barrier material layer and a reflow enhancement layer in the combined via/line opening and on a topmost surface of the second interconnect dielectric material layer.

Referring now to FIG. 2, there is illustrated the exemplary semiconductor structure of FIG. 1 after forming a diffusion barrier material layer 24 and a reflow enhancement layer 26 in the combined via/line opening 22 and on a topmost surface of the second interconnect dielectric material layer 20.

The diffusion barrier material layer 24 includes a second diffusion barrier material which may include one of the diffusion barrier materials mentioned above for the first diffusion barrier material. In one embodiment, the first and second diffusion barrier materials may be composed of a same diffusion barrier material. In another embodiment, the first and second diffusion barrier materials are composed of different diffusion barrier materials. The second diffusion barrier material that provides diffusion barrier material layer 24 may be formed utilizing one of the deposition processes mentioned above for forming the first diffusion barrier material, and the second diffusion barrier material that provides diffusion barrier material layer 24 may have a thickness within the thickness range mentioned above for the first diffusion barrier material.

The reflow enhancement layer 26 is formed on the diffusion barrier material layer 24. The reflow enhancement layer 26 that is employed in the present application is composed of a metal or metal alloy that is electrically conductive and enhances, i.e., improves, the subsequent reflow of a metal or metal alloy that is formed on the reflow enhancement layer 26. The metal or metal alloy that provides the reflow enhancement layer 26 may include copper (Cu), aluminum (Al), or a copper-aluminum (Cu—Al) alloy in which the content of copper may be greater than, equal to, or less than the content of aluminum. The metal or metal alloy that provides the reflow enhancement layer 26 may have a first bulk resistivity that is typically within a range from 1.5 $\mu\Omega\cdot$cm to 3.0 $\mu\Omega\cdot$cm, wherein $\mu\Omega$ equals microohms. Bulk resistivity (or volume resistivity) is a constant value for a certain material at a certain environment (typically measured at 20° C.). The bulk resistivity is a measure of the resistivity across a defined thickness of the material.

The thickness of the reflow enhancement layer 26 may vary depending on the material of the reflow enhancement layer 26 as well as the technique used in forming the same. Typically, the reflow enhancement layer 26 has a thickness from 1 nm to 80 nm. The reflow enhancement layer 26 can be formed by a conventional deposition process including, for example, CVD, PECVD, ALD, or PVD.

At this stage of the present application, the diffusion barrier material layer 24 and the reflow enhancement layer 26 are both continuously present in the combined via/line opening 22, and a portion of the bottommost surface of the diffusion barrier material layer 24 is formed directly upon the exposed topmost surface of the a metal-containing structure 16 of the lower interconnect level, $L_n$. Also, the diffusion barrier material layer 24 and the reflow enhancement layer 26 have a combined thickness that does not entirely fill the combined via/line opening 22 that is present in the second interconnect dielectric material layer 20.

Figure 3:
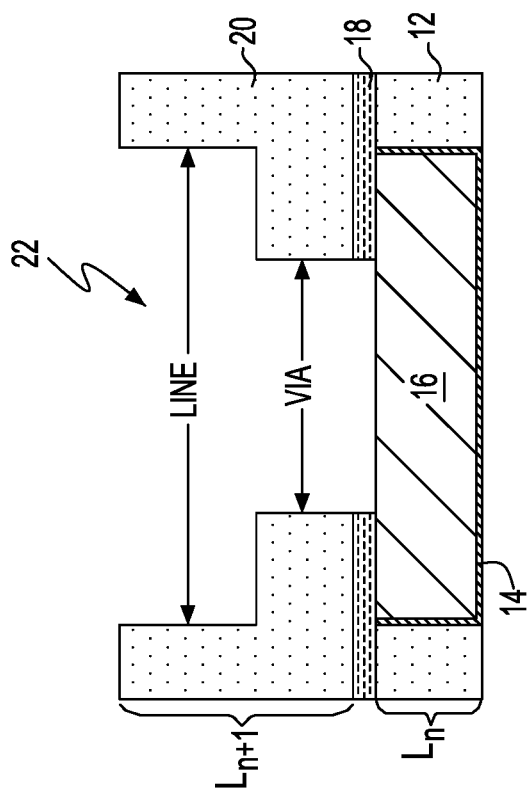
FIG. 3 is a cross sectional view of the exemplary semiconductor structure of FIG. 2 after forming a first metal or metal alloy layer on the reflow enhancement layer.

Referring now to FIG. 3, there is illustrated the exemplary semiconductor structure of FIG. 2 after forming a first metal or metal alloy layer 28 on the reflow enhancement layer 26. The first metal or metal alloy layer 28 is a continuous layer which does not completely fill in the combined via/line opening 22. The first metal or metal alloy layer 28 is composed of an electrically conductive metal or metal alloy that has a second bulk resistivity that is higher than the first bulk resistivity of the metal or metal alloy that provides the reflow enhancement layer 26; thus the first metal or metal alloy layer 28 is composed of a different electrically conductive metal or metal alloy as compared with the metal or metal alloy that provides the reflow enhancement layer 26. The second bulk resistivity is typically within a range from to 3.5 μΩ·cm to 8.0 μΩ·cm. Examples of electrically conductive metals or metal alloys that can be used in providing the first metal or metal alloy layer 28 include, but are not limited to, cobalt (Co), ruthenium (Ru), rhodium (Rh), iridium (Ir), tungsten (W), nickel (Ni) or alloys thereof.

The thickness of the first metal or metal alloy layer 28 may vary depending on the material of the first metal or metal alloy layer 28 as well as the technique used in forming the same. Typically, the first metal or metal alloy layer 28 has a thickness from 1 nm to 100 nm. The first metal or metal alloy layer 28 can be formed by a conventional deposition process including, for example, CVD, PECVD, ALD, or PVD.

Figure 4:
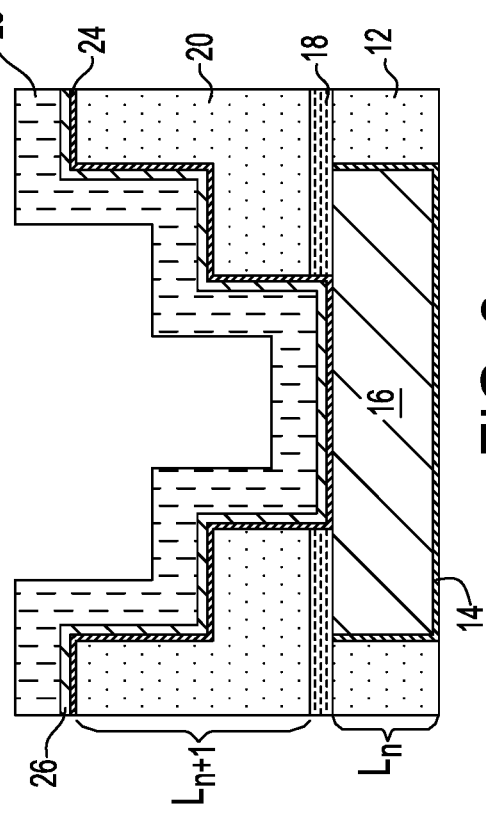
FIG. 4 is a cross sectional view of the exemplary semiconductor structure of FIG. 3 after performing a reflow anneal process in which the reflow enhancement layer is converted into an alloy layer and the first metal or metal alloy layer is reflown into the combined via/line opening.

Referring now to FIG. 4, there is illustrated the exemplary semiconductor structure of FIG. 3 after performing a reflow anneal process in which the reflow enhancement layer 26 is converted into an alloy layer 30 and the first metal or metal alloy layer 28 is reflown into the combined via/line opening 22. The reflown first metal or metal alloy layer 28 is labeled as element 28R in the drawings. In this embodiment, the reflown first metal or metal alloy layer 28R is present in both the via portion and the line portion of the combined via/line opening 22.

The reflow anneal may include a furnace anneal or a laser anneal; laser annealing is typically performed for a shorter period of time than furnace anneal. The reflow anneal is performed at a temperature that forms the alloy layer 30 and reflows the first metal or metal alloy layer 28. In this embodiment, the forming the alloy layer 30 occurs by diffusing the first metal or metal alloy from the first metal or metal alloy layer 28 into the reflow enhancement layer 26 such that a reaction occurs between the diffused first metal or metal alloy and the reflow enhancement layer. In one example, the reflow anneal may be performed at a temperature from 150° C. to 800° C.

The alloy layer 30 is composed of a combination, i.e., alloy, of the reflow enhancement layer 26 (i.e., metal or metal alloy having the first bulk resistivity) and the first metal or metal alloy layer 28 (i.e., electrically conductive metal or metal alloy having the second bulk resistivity). In one example, the alloy layer 30 is composed of a Cu—Co alloy. Alloy layer 30 is an electrically conductive layer as well. The alloy layer 30 is continuously present between the reflown first metal or metal alloy layer 28R and the diffusion barrier layer 24. The alloy layer 30 may have a thickness from 0.5 nm to 80 nm. Other thicknesses for the alloy layer 30 are also contemplated.

Figure 5:
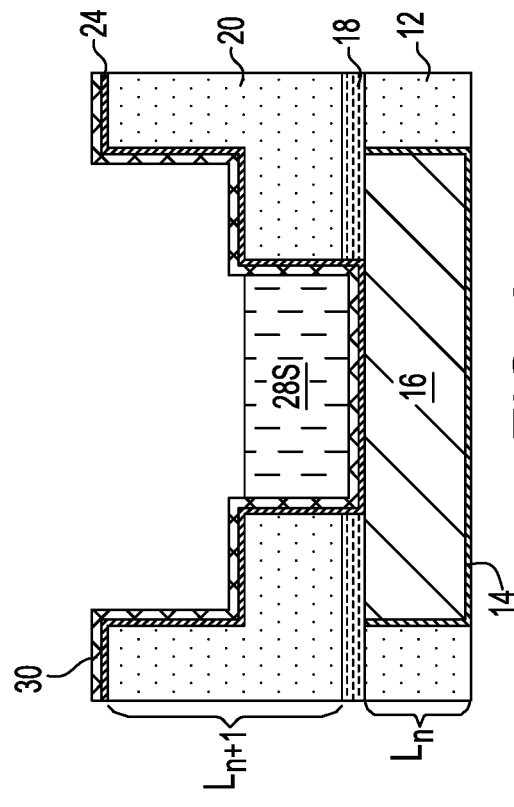
FIG. 5 is a cross sectional view of the exemplary semiconductor structure of FIG. 4 after performing a planarization process.

Referring now to FIG. 5, there is illustrated the exemplary semiconductor structure of FIG. 4 after performing a planarization process. In one example, the planarization process may include chemical mechanical polishing. The planarization process (i.e., material removal process) removes material that is present outside of the combined via/line opening 22 and atop the second interconnect dielectric material layer 20. For this embodiment, the planarization process removes the reflown first metal or metal alloy layer 28R, the alloy layer 30 and the diffusion barrier layer 26 that are present outside of the combined via/line opening 22 and atop the second interconnect dielectric material layer 20. A portion of the reflown first metal or metal alloy layer 28R, a portion of the alloy layer 30 and a portion of the diffusion barrier layer 24 remain in the combined via/line opening 22 after the planarization process. The portion of the reflown first metal or metal alloy layer 28R that remains in the combined via/line opening 22 may be referred to as an electrically conductive structure 28S. The portion of the alloy layer 30 that remains in the combined via/line opening 22 may be referred to as an alloy liner 30L. The portion of the diffusion barrier layer 24 that remains in the combined via/line opening 22 may be referred to as a diffusion barrier liner 24L.

In this embodiment and as shown in FIG. 5, the electrically conductive structure 28S has a topmost surface that is coplanar with topmost surfaces of the alloy liner 30L and the diffusion barrier liner 24L as well as a topmost surface of the second interconnect dielectric material layer 20.

Figure 6:
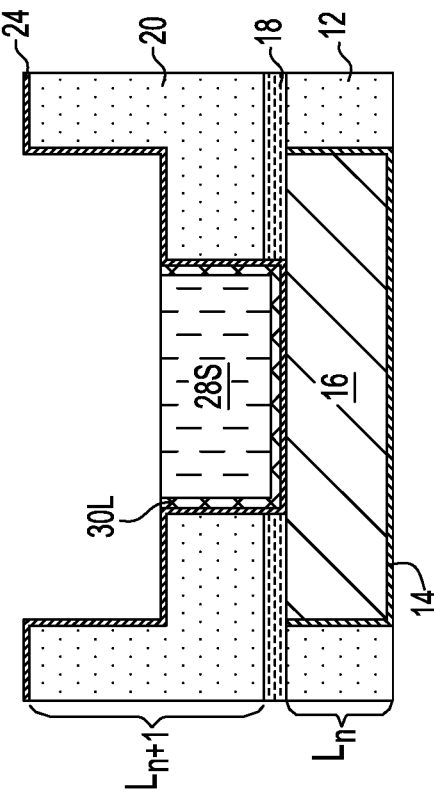
FIG. 6 is a cross sectional view of an exemplary semiconductor structure similar to FIG. 3 and after performing a reflow anneal process in which the reflow enhancement layer is converted into an alloy layer and the first metal or metal alloy layer is reflown into the via portion of the combined via/line opening.

Referring now to FIG. 6, there is illustrated an exemplary semiconductor structure similar to FIG. 3 and after performing a reflow anneal process in which the reflow enhancement layer 26 is converted into an alloy layer 30 and the first metal or metal alloy layer 28 is flown into the via portion of the combined via/line opening 22. In this embodiment, the first metal or metal alloy 28 that is formed has a thickness that is less than the thickness of the first metal or metal alloy 28 that was formed in the embodiment illustrated in FIG. 3 such that during the reflow anneal the reflown first metal or metal alloy layer provides an electrically conductive structure 28S that is present only within the via portion of the combined via and line opening 22. The reflow anneal of this embodiment is the same as the reflow anneal described in providing the structure shown in FIG. 4 of the present application.

Figure 7:
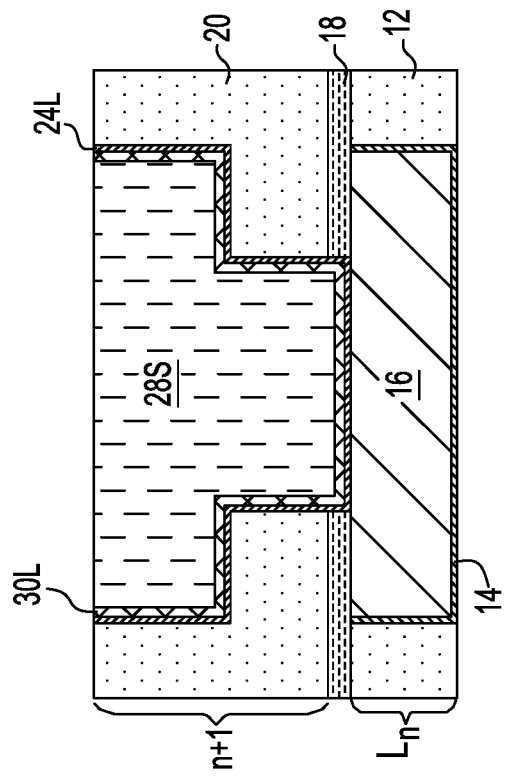
FIG. 7 is a cross sectional view of the exemplary semiconductor structure of FIG. 6 after forming a second metal or metal alloy structure in the line portion of the combined via/line opening and atop the reflown first metal or metal alloy layer and performing a planarization process.

Referring now to FIG. 7, there is illustrated the exemplary semiconductor structure of FIG. 6 after forming a second metal or metal alloy layer (not specifically shown) in the line portion of the combined via/line opening 22 and atop the reflown first metal or metal alloy layer and performing a planarization process. In this embodiment, the reflown first metal or metal alloy that is present in the via portion of the combined via/line opening 22 provides a first electrically conductive structure 28S.

The second metal or metal alloy layer is composed of a second electrically conductive metal or metal alloy, which may be the same as, or different from, the first electrically conductive metal or metal alloy that provides the first metal or metal alloy layer 28 and hence the first electrically conductive structure 28S. In some embodiments, the second metal or metal alloy layer may be composed of a second electrically conductive metal or metal alloy having the first bulk resistivity mentioned above. Examples of such electrically conductive metals or metal alloys include, but are not limited to, copper (Cu), aluminum (Al), or a copper-aluminum (Cu—Al) alloy in which the content of copper may be greater than, equal to, or less than the content of aluminum.

In other embodiments, the second metal or metal alloy layer may be composed of a second electrically conductive metal or metal alloy having the second bulk resistivity mentioned above. Examples of such electrically conductive metals or metal alloys include, but are not limited to, cobalt (Co), ruthenium (Ru), rhodium (Rh), iridium (Ir), tungsten (W), nickel (Ni) or alloys thereof.

The second metal or metal alloy layer is formed by first depositing one of the above mentioned second electrically conductive metals or metal alloys. In some embodiments, another reflow anneal may be performed. A planarization process is then performed that removes any overburden material that is present outside the combined via/line opening 22 and on the topmost surface of the second interconnect dielectric material layer 20. The remaining second metal or metal alloy layer that is present in the combined via/line opening 22 is referred to herein as second electrically conductive structure 32S, the remaining alloy layer 30 that is present in the combined via/line opening 22 may be referred to as an alloy liner 30L, while the remaining diffusion barrier layer 24 that is present in the combined via/line opening 22 may be referred to herein as a diffusion barrier liner 24L.

In this embodiment of the present application, and as shown in FIG. 7, the first electrically conductive structure 28S is located entirely in the via portion and has a topmost surface that is coplanar with a topmost surface of the via portion of the combined via/line opening 22. A second electrically conductive structure 32S is present on a topmost surface of the first electrically conductive structure 28S. The second electrically conductive structure 32S has a topmost surface that is coplanar with topmost surfaces of the alloy liner 30L and the diffusion barrier liner 24L as well as a topmost surface of the second interconnect dielectric material layer 20.

Variations of the exemplary semiconductor structure shown in FIG. 7 can be made by varying the height of the first electrically conductive structure 28S that is formed. For example, it is possible to form a structure in which the first electrically conductive structure 28S is present only within a bottom portion of the via portion of the combined via/line opening 22. In such an embodiment, the second electrically conductive structure 32S can be formed within an upper portion of the via portion of the combined via/line opening 22 as well as the entirety of the line portion of the combined via/line opening 22. In another example, it is possible to form a structure in which the first electrically conductive structure 28S is present within the entirety of the via portion of the combined via/line opening 22 and a bottom portion of the line portion of the combined via/line opening 22. In such an embodiment, the second electrically conductive structure 32S can be formed within an upper portion of the line portion of the combined via/line opening 22.

Figure 8:
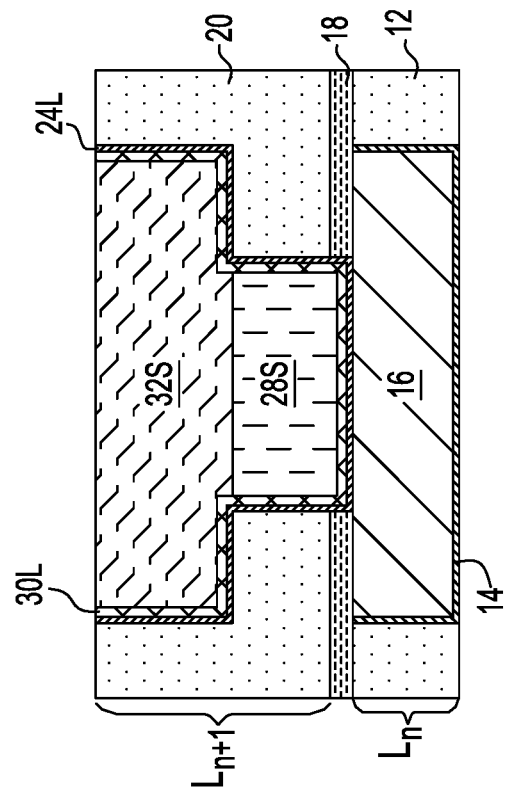
FIG. 8 is a cross sectional view of the exemplary semiconductor structure of FIG. 6 after removing the alloy layer from the line portion of the combined via/line opening.

Referring now to FIG. 8, there is illustrated the exemplary semiconductor structure of FIG. 6 after removing the alloy layer 30 from the line portion of the combined via/line opening 22. An alloy liner 30L remains in the via portion of the combined via/line opening 22 and is located on sidewalls and a bottommost wall of the first electrically conductive structure 28S. In the embodiment illustrated in FIG. 8, the alloy liner 30L is U-shaped and has topmost surfaces that are coplanar with a topmost surface of the first electrically conductive structure 28S. The removal of the alloy layer 30 from the line portion of the combined via/line opening 22 exposes surfaces of the diffusion barrier layer 24 in the line portion of the combined via/line opening 22.

The removal of the alloy layer 30 from the line portion of the combined via/line opening 22 may be performed utilizing a wet etch process in which a chemical etchant that is selective for removing the alloy layer 30 is employed. In one example, a mixture of metal hydroxides with other compounds can be used as the etchant. The diffusion barrier material layer 24 can be employed in the present application as an etch stop layer.

Figure 9:
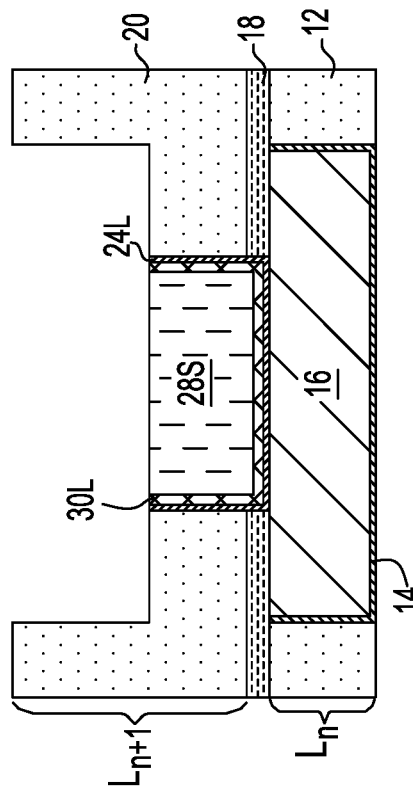
FIG. 9 is a cross sectional view of the exemplary semiconductor structure of FIG. 8 after forming a second electrically conductive structure in the line portion of the combined via/line opening.

Referring now to FIG. 9, there is illustrated the exemplary semiconductor structure of FIG. 8 after forming a second electrically conductive structure 32S in the line portion of the combined via/line opening 22. In this embodiment, the second electrically conductive structure 32S has surfaces that directly contact exposed portions of the diffusion barrier layer 24 in the line portion of the combined via/line opening 22.

The second electrically conductive structure 32S may include one of the second electrically conductive metals or metal alloys mentioned above for the second metal or metal alloy layer. Thus, the second electrically conductive structure 32S may be composed of a second electrically conductive metal or metal alloy that is the same as, or different from, the first electrically conductive metal or metal alloy that provides the first metal or metal alloy layer 28 and hence the first electrically conductive structure 28S. In some embodiments, the second metal or metal alloy layer may be composed of a second electrically conductive metal or metal alloy having the first bulk resistivity mentioned above. Examples of such electrically conductive metals or metal alloys include, but are not limited to, copper (Cu), aluminum (Al), or a copper-aluminum (Cu—Al) alloy in which the content of copper may be greater than, equal to, or less than the content of aluminum.

In other embodiments, the second metal or metal alloy layer may be composed of a second electrically conductive metal or metal alloy having the second bulk resistivity mentioned above. Examples of such electrically conductive metals or metal alloys include, but are not limited to, cobalt (Co), ruthenium (Ru), rhodium (Rh), iridium (Ir), tungsten (W), nickel (Ni) or alloys thereof.

The second electrically conductive structure 32S of this embodiment may be formed by first depositing one of the above mentioned second electrically conductive metals or metal alloys. In some embodiments, another reflow anneal may be performed. A planarization process is then performed that removes any overburden material that is present outside the combined via/line opening 22 and on the topmost surface of the second interconnect dielectric material layer 20. The remaining second metal or metal alloy layer that is present in the combined via/line opening 22 is referred to herein as second electrically conductive structure 32S, while the remaining diffusion barrier layer 24 that is present in the combined via/line opening 22 may be referred to herein as a diffusion barrier liner 24L.

In this embodiment of the present application, and as shown in FIG. 9, the first electrically conductive structure 28S is located entirely in the via portion and has a topmost surface that is coplanar with a topmost surface of the via portion of the combined via/line opening 22 as well as being coplanar with topmost surfaces of the alloy liner 30L. A second electrically conductive structure 32S is present on a topmost surface of the first electrically conductive structure 28S. The second electrically conductive structure 32S has a topmost surface that is coplanar with topmost surfaces of the diffusion barrier liner 24L as well as a topmost surface of the second interconnect dielectric material layer 20.

Variations of the exemplary semiconductor structure shown in FIG. 9 can be made by varying the height of the first electrically conductive structure 28S that is formed. For example, it is possible to form a structure in which the first electrically conductive structure 28S is present only within a bottom portion of the via portion of the combined via/line opening 22. In such an embodiment, the second electrically conductive structure 32S can be formed within an upper portion of the via portion of the combined via/line opening 22 as well as the entirety of the line portion of the combined via/line opening 22. In another example, it is possible to form a structure in which the first electrically conductive structure 28S is present within the entirety of the via portion of the combined via/line opening 22 and a bottom portion of the line portion of the combined via/line opening 22. In such an embodiment, the second electrically conductive structure 32S can be formed within an upper portion of line portion of the combined via/line opening 22.

Figure 10:
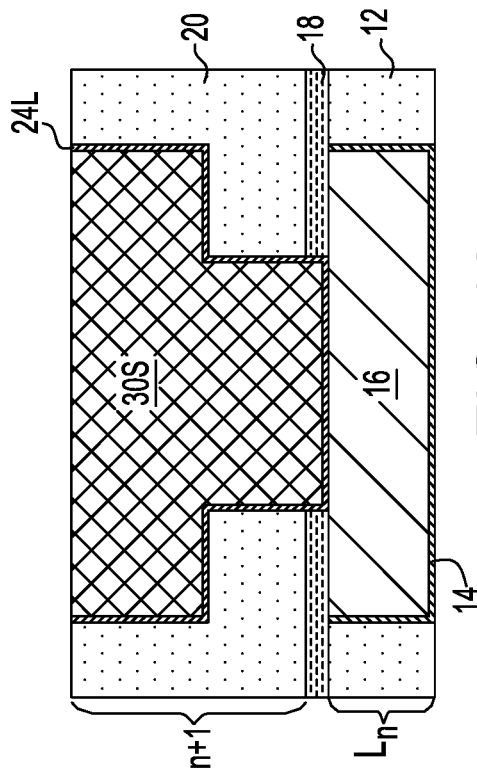
FIG. 10 is a cross sectional view of the exemplary semiconductor structure of FIG. 8 after removing the diffusion barrier layer from the line portion of the combined via/line opening.

Referring now to FIG. 10, there is illustrated the exemplary semiconductor structure of FIG. 8 after removing the diffusion barrier layer 24 from the line portion of the combined via/line opening 22. A diffusion barrier liner 24L remains in the via portion of the combined via/line opening 22 and is located beneath the alloy liner 30L. In the embodiment illustrated in FIG. 10, the alloy liner 30L and the diffusion barrier liner 24L are both U-shaped and have topmost surfaces that are coplanar with each other as well as being coplanar with a topmost surface of the first electrically conductive structure 28S. The removal of the diffusion barrier layer 24 from the line portion of the combined via/line opening 22 exposes surfaces of the second interconnect dielectric material layer 20 in the line portion of the combined via/line opening 22.

The removal of the diffusion barrier layer 24 from the line portion of the combined via/line opening 22 may be performed utilizing a wet etch process in which a chemical etchant that is selective for removing the diffusion barrier layer 24 is employed. In one example, a mixture of metal hydroxides with other compounds can be used as the etchant.

Figure 11:
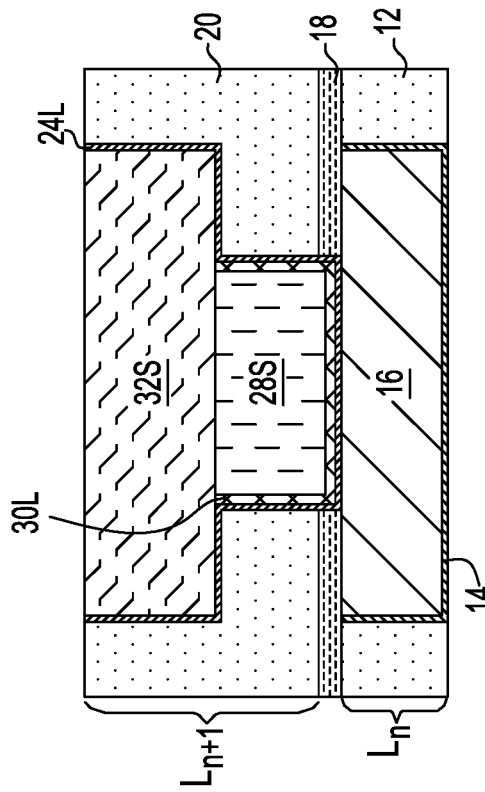
FIG. 11 is a cross sectional view of the exemplary semiconductor structure of FIG. 10 after forming a second electrically conductive structure in the line portion of the combined via/line opening.

Referring now to FIG. 11, there is illustrated the exemplary semiconductor structure of FIG. 10 after forming a second electrically conductive structure 32S in the line portion of the combined via/line opening 22. In this embodiment, the second electrically conductive structure 32S has surfaces that directly contact exposed portions of the second interconnect dielectric material layer 20 in the line portion of the combined via/line opening 22.

The second electrically conductive structure 32S may include one of the second electrically conductive metals or metal alloys mentioned above for the second metal or metal alloy layer. Thus, the second electrically conductive structure 32S may be composed of a second electrically conductive metal or metal alloy that is the same as, or different from, the first electrically conductive metal or metal alloy that provides the first metal or metal alloy layer 28 and hence the first electrically conductive structure 28S. In some embodiments, the second metal or metal alloy layer may be composed of a second electrically conductive metal or metal alloy having the first bulk resistivity mentioned above. Examples of such electrically conductive metals or metal alloys include, but are not limited to, copper (Cu), aluminum (Al), or a copper-aluminum (Cu—Al) alloy in which the content of copper may be greater than, equal to, or less than the content of aluminum.

In other embodiments, the second metal or metal alloy layer may be composed of a second electrically conductive metal or metal alloy having the second bulk resistivity mentioned above. Examples of such electrically conductive metals or metal alloys include, but are not limited to, cobalt (Co), ruthenium (Ru), rhodium (Rh), iridium (Ir), tungsten (W), nickel (Ni) or alloys thereof.

The second electrically conductive structure 32S of this embodiment may be formed by first depositing one of the above mentioned second electrically conductive metal or metal alloys. In some embodiments, another reflow anneal may be performed. A planarization process is then performed that removes any overburden material that is present outside the combined via/line opening 22 and on the topmost surface of the second interconnect dielectric material layer 20. The remaining second metal or metal alloy layer that is present in the combined via/line opening 22 is referred to herein as second electrically conductive structure 32S, while the remaining diffusion barrier layer 24 that is present in the combined via/line opening 22 may be referred to herein as a diffusion barrier liner 24L.

In this embodiment of the present application, and as shown in FIG. 11, the first electrically conductive structure 28S is located entirely in the via portion and has a topmost surface that is coplanar with a topmost surface of the via portion of the combined via/line opening 22 as well as being coplanar with topmost surfaces of the alloy liner 30L and the diffusion barrier liner 24L. A second electrically conductive structure 32S is present on a topmost surface of the first electrically conductive structure 28S. The second electrically conductive structure 32S has a topmost surface that is coplanar with a topmost surface of the second interconnect dielectric material layer 20. In this embodiment, the second electrically conductive structure 32S has surfaces that directly contact surfaces of the second interconnect dielectric material layer 20 that are present in the line portion of the combined via/line opening 22.

Variations of the exemplary structure shown in FIG. 11 can be made by varying the height of the first electrically conductive structure 28S that is formed. For example, it is possible to form a structure in which the first electrically conductive structure 28S is present only within a bottom portion of the via portion of the combined via/line opening 22. In such an embodiment, the second electrically conductive structure 32S can be formed within an upper portion of the via portion of the combined via/line opening 22 as well as the entirety of the line portion of the combined via/line opening 22. In another example, it is possible to form a structure in which the first electrically conductive structure 28S is present within the entirety of the via portion of the combined via/line opening 22 and a bottom portion of the line portion of the combined via/line opening 22. In such an embodiment, the second electrically conductive structure 32S can be formed within an upper portion of line portion of the combined via/line opening 22.

Referring now to FIGS. 12-16, there are illustrated various processing steps that provide a semiconductor structure in accordance with a second embodiment of the present application. In FIGS. 12-16, there are shown processing steps that provide semiconductor structures that include an interconnect level, $L_{n+1}$, including an interconnect dielectric material layer 20 having a combined via/line opening 22 located therein. A diffusion barrier liner 24L is located in at least the via portion of the combined via/line opening 22. A first electrically conductive structure 30S is located on the diffusion barrier liner 24L and is present in at least the via portion of the combined via/line opening 22. In this embodiment, the first electrically conductive structure 30S includes a combination, i.e., alloy, of a first metal or metal alloy having a first bulk resistivity and a second metal or metal alloy having a second bulk resistivity that is higher than the first bulk resistivity. In some embodiments, a second electrically conductive structure 32S is present in at least the line portion of the combined via/line opening 22. The second electrically conductive structure 32S may include a metal or metal alloy having either the first bulk resistivity or the second bulk resistivity.

Figure 12:
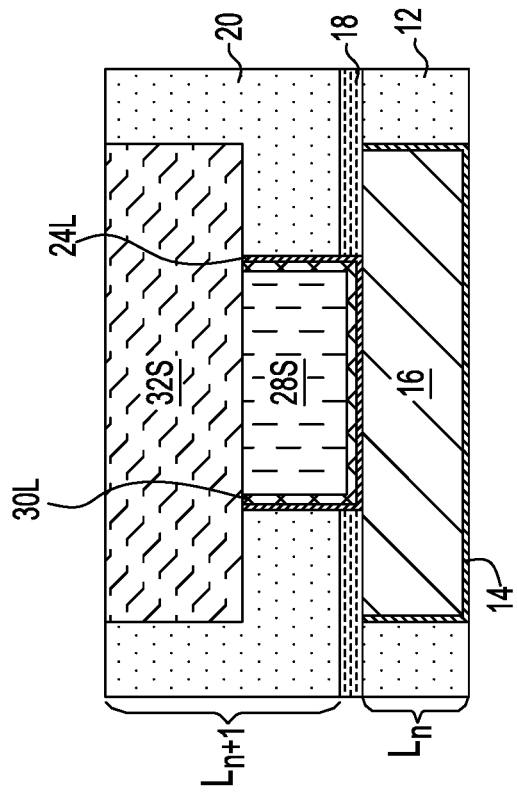
FIG. 12 is a cross sectional view of an exemplary semiconductor structure similar to FIG. 3 and after performing a reflow anneal process in which the reflow enhancement layer and the first metal or metal alloy layer are completely converted into an electrically conductive metal alloy and performing a planarization process.

Referring now to FIG. 12, there is illustrated an exemplary semiconductor structure similar to FIG. 3 and after performing a reflow anneal process in which the reflow enhancement layer 26 and the first metal or metal alloy layer 28 is completely converted into an electrically conductive metal alloy and performing a planarization process; reflow of the first metal alloy layer 28 occurs during the reflow anneal as well. The electrically conductive metal alloy of this embodiment provides an electrically conductive structure 30S.

The reflow anneal that is employed in this embodiment may include a furnace anneal or a laser anneal; laser annealing is typically performed for a shorter period of time than furnace anneal. The reflow anneal of this embodiment is performed at a temperature that completely converts the reflow enhancement layer 26 and the first metal or metal alloy layer 28 into the electrically conductive metal or metal alloy that provides the electrically conductive structure 30S. In this embodiment, the forming the electrically conductive structure 30S occurs by diffusing the metal or metal alloy that provides the reflow enhancement layer 26 into the first metal or metal alloy layer 28 such that a reaction occurs between the diffused metal or metal alloy of the reflow enhancement layer 26 and the first metal or metal alloy layer 28. In one example, the reflow anneal may be performed at a temperature from 150° C. to 1000° C.

The electrically conductive structure 30S is composed of a combination of the reflow enhancement layer 26 (i.e., electrically conductive metal or metal alloy having the first bulk resistivity) and the first metal or metal alloy layer 28 (i.e., electrically conductive metal or metal alloy having the second bulk resistivity). In one example, the electrically conductive structure 30S is composed of a Co—Cu alloy.

Following the reflow anneal, a planarization process such as, for example, chemical mechanical polishing, may be employed to remove the overburdened electrically conductive metal alloy and diffusion barrier material that is present outside the combined via/line opening 22 and atop the second interconnect dielectric material layer 20. The remaining electrically conductive metal alloy that is present in the combined via/line opening 22 provides the electrically conductive structure 30S of this embodiment. The remaining diffusion barrier layer 24 that is present in the combined via/line opening 22 provides the diffusion barrier liner 24L of this embodiment.

In this embodiment, and as illustrated in FIG. 12, the electrically conductive structure 30S is present in both the line portion and the via portion of the combined via/line opening 22. A diffusion barrier liner 24L is also present in the combined via/line opening 22. In this embodiment, the electrically conductive structure 30S has a topmost surface that is coplanar with topmost surfaces of the diffusion barrier liner 24L as well as a topmost surface of the second interconnect dielectric material layer 20.

Figure 13:
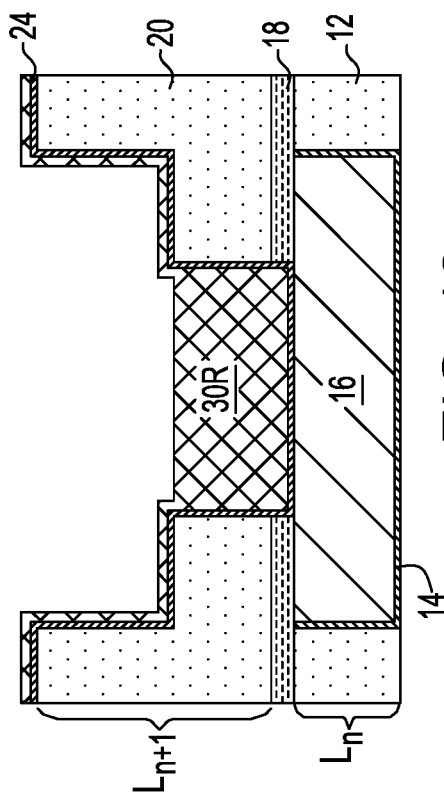
FIG. 13 is a cross sectional view of a cross sectional view of an exemplary semiconductor structure similar to FIG. 3 and after performing a reflow anneal process in which the reflow enhancement layer and the first metal or metal alloy layer are completely converted into an electrically conductive metal alloy.

Referring now to FIG. 13, there is illustrated an exemplary semiconductor structure similar to FIG. 3 and after performing a reflow anneal process in which the reflow enhancement layer and the first metal or metal alloy layer is completely converted into a reflown electrically conductive metal alloy layer 30R; reflow of the first metal alloy layer 28 occurs during the reflow anneal as well. In this embodiment, the first metal or metal alloy layer 28 that is formed has a thickness that is less than the thickness of the first metal or metal alloy layer 28 that was formed in the embodiment illustrated in FIG. 3. In this embodiment, the reflown electrically conductive metal alloy layer 30R is present in the via portion of the combined via/line opening 22 as well as the line opening of the combined via/line opening. In the line portion, the reflown electrically conductive metal alloy layer 30R does not completely fill in the line portion, but instead is present as a liner. The reflow anneal of this embodiment is the same as the reflow anneal described in providing the structure shown in FIG. 12 of the present application.

Figure 14:
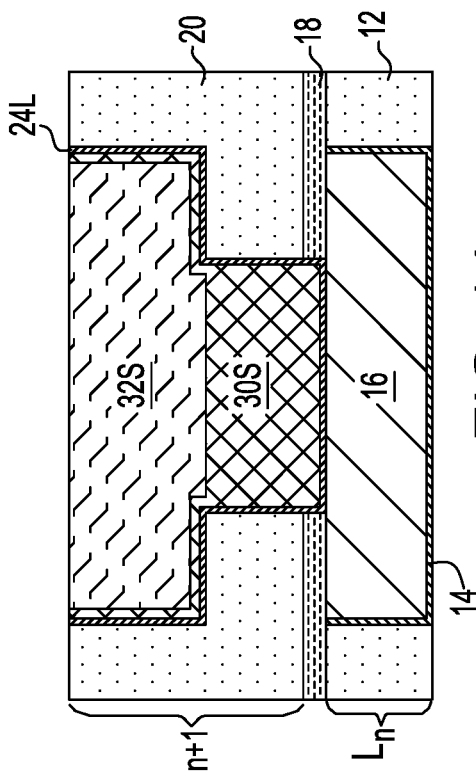
FIG. 14 is a cross sectional view of the exemplary semiconductor structure of FIG. 13 after forming a second metal or metal alloy layer and performing a planarization process.

Referring now to FIG. 14, there is illustrated the exemplary semiconductor structure of FIG. 13 after forming a second metal or metal alloy layer (not shown) and performing a planarization process. In some embodiments, the second metal or metal alloy layer may be composed of an electrically conductive metal or metal alloy having the first bulk resistivity as mentioned above. Examples of such electrically conductive metals or metal alloys include, but are not limited to, copper (Cu), aluminum (Al), or a copper-aluminum (Cu—Al) alloy in which the content of copper may be greater than, equal to, or less than the content of aluminum.

In other embodiments, the second metal or metal alloy layer may be composed of an electrically conductive metal or metal alloy having the second bulk resistivity mentioned above. Examples of such electrically conductive metals or metal alloys include, but are not limited to, cobalt (Co), ruthenium (Ru), rhodium (Rh), iridium (Ir), tungsten (W), nickel (Ni) or alloys thereof.

The second metal or metal alloy layer of this embodiment may be formed by first depositing one of the above mentioned electrically conductive metal or metal alloys. In some embodiments, another reflow anneal may be performed. A planarization process is then performed that removes any overburden material that is present outside the combined via/line opening 22 and on the topmost surface of the second interconnect dielectric material layer 20. The remaining second metal or metal alloy layer that is present in the combined via/line opening 22 is referred to herein as second electrically conductive structure 32S, the remaining diffusion barrier layer 24 that is present in the combined via/line opening 22 may be referred to herein as a diffusion barrier liner 24L, and the remaining reflown electrically conductive metal alloy 30R that is present in the combined via/line opening 22 may be referred to herein as a first electrically conductive structure 30S.

In this embodiment, the first electrically conductive structure 30S is present in the via portion as well as the line portion of the combined via/line opening 22. In the line portion, the first electrically conductive structure 30S laterally surroundings the second electrically conductive structure 32S. In this embodiment, the topmost surfaces of each of the diffusion barrier liner 24L, the first electrically conductive structure 30S and the second electrically conductive structure 32S are coplanar with each other as well as being coplanar with a topmost surface of the second interconnect dielectric material layer 20. The height of the first electrically conductive structure 30S may vary in the embodiment depicted in FIG. 14.

Figure 15:
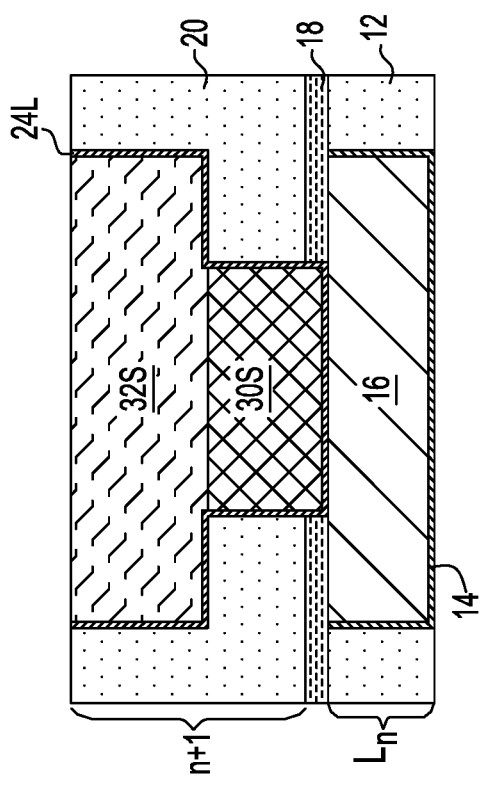
FIG. 15 is a cross sectional view of a variation of the exemplary semiconductor structure of FIG. 12.
Figure 16:
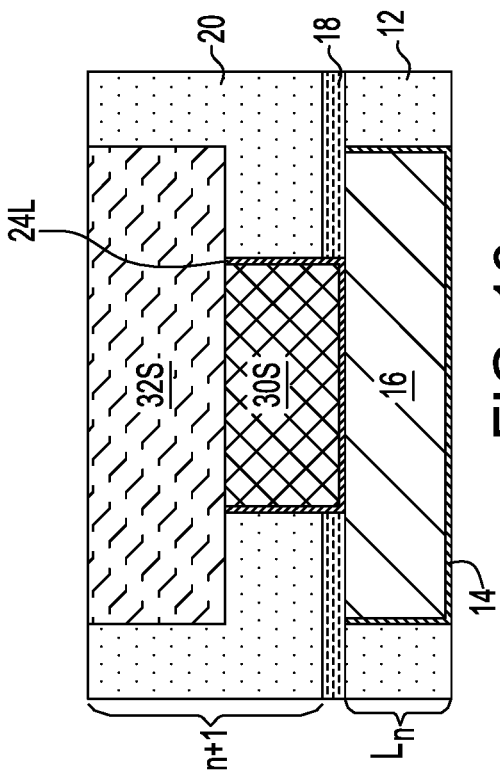
FIG. 16 is a cross sectional view of a variation of the exemplary semiconductor structure of FIG. 12.

Referring now to FIGS. 15 and 16, there are illustrated exemplary semiconductor structures that are a variation of the exemplary semiconductor structure of FIG. 12. The exemplary structures of FIGS. 15 and 16 can be formed utilizing the basic processing steps of the present application as described herein. The exemplary structure of FIG. 15 includes a first electrically conductive structure 30S located entirely in the via portion of the combined via/line opening 22, and a second electrically conductive structure 32S that is located in the line portion of the combined via/line opening 22. In the embodiment illustrated in FIG. 15, a diffusion barrier liner 24L is present in both the via and line portions of the combined via/line opening 22. Also, and in the embodiment illustrated in FIG. 15, the first electrically conductive structure 30S is located entirely beneath the second electrically conductive structure 32S. Further, and in the embodiment illustrated in FIG. 15, topmost surfaces of the diffusion barrier liner 24L and the second electrically conductive structure are coplanar with each other as well as being coplanar with a topmost surface of the second interconnect dielectric material layer 20.

The embodiment shown in FIG. 16 is similar to the embodiment shown in FIG. 15 except that the diffusion barrier liner 24L is not present in the line portion of the combined via/line opening 22. In the embodiment shown in FIG. 16, both the diffusion barrier liner 24L and the first electrically conductive structure 30S are located entirely beneath the second electrically conductive structure 32S. In the embodiment illustrated in FIG. 16, the second electrically conductive structure 32S has surfaces that directly contact surfaces of the second interconnect dielectric material layer 20. Also, and in the embodiment illustrated in FIG. 16, the second electrically conductive structure 32S has a topmost surface that is coplanar with a topmost surface of the second interconnect dielectric material layer.

Variations of the exemplary structures shown in FIGS. 15 and 16 can be made by varying the height of the first electrically conductive structure 30S that is formed. For example, it is possible to form a structure in which the first electrically conductive structure 30S is present only within a bottom portion of the via portion of the combined via/line opening 22. In such an embodiment, the second electrically conductive structure 32S can be formed within an upper portion of the via portion of the combined via/line opening 22 as well as the entirety of the line portion of the combined via/line opening 22. In another example, it is possible to form a structure in which the first electrically conductive structure 30S is present within the entirety of the via portion of the combined via/line opening 22 and a bottom portion of the line portion of the combined via/line opening 22. In such an embodiment, the second electrically conductive structure 32S can be formed within an upper portion of line portion of the combined via/line opening 22.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
an interconnect level comprising an interconnect dielectric material layer having a combined via/line opening located therein;
a diffusion barrier liner located in at least a via portion of the combined via/line opening;
an alloy liner located on the diffusion barrier liner and present in at least the via portion of the combined via/line opening, wherein the alloy liner comprises an alloy of a first metal or metal alloy having a first bulk resistivity and a second metal or metal alloy having a second bulk resistivity that is higher than the first bulk resistivity; and
a first electrically conductive structure located on the alloy liner and present in at least the via portion of the combined via/line opening, wherein the first electrically conductive structure comprises the second metal or metal alloy having the second bulk resistivity, wherein the first bulk resistivity is from 1.5 $\mu\Omega\cdot$cm to 3.0 $\mu\Omega\cdot$cm, the second bulk resistivity is from 3.5 $\mu\Omega\cdot$cm to 8.0 $\mu\Omega\cdot$cm, the first metal or metal alloy comprises copper (Cu), aluminum (Al), or a copper-aluminum (Cu—Al) alloy, and the second metal or metal alloy comprises cobalt (Co), ruthenium (Ru), rhodium (Rh), iridium (Ir), tungsten (W), nickel (Ni) or alloys thereof.

2. The semiconductor structure of claim 1, wherein the diffusion barrier liner, the alloy liner, and the first electrically conductive structure are also present in a line portion of the combined via/line opening, and topmost surfaces of the diffusion barrier liner, the alloy liner, and the first electrically conductive structure are coplanar with each other as well as being coplanar with a topmost surface of the interconnect dielectric material layer.

3. The semiconductor structure of claim 1, further comprising a second electrically conductive structure present in at least a line portion of the combined via/line opening and located directly on the first electrically conductive structure.

4. The semiconductor structure of claim 3, wherein the second electrically conductive structure comprises another metal or metal alloy having the first bulk resistivity.

5. The semiconductor structure of claim 3, wherein the second electrically conductive structure comprises another metal or metal alloy having the second bulk resistivity.

6. The semiconductor structure of claim 3, wherein the first electrically conductive structure is present on sidewalls of the second electrically conductive structure.

7. The semiconductor structure of claim 3, wherein the alloy liner is present only in the via portion of the combined via/line opening.

8. The semiconductor structure of claim 7, wherein the diffusion barrier liner is present only in the via portion of the combined via/line opening.

9. A semiconductor structure comprising:
an interconnect level comprising an interconnect dielectric material layer having a combined via/line opening located therein;
a diffusion barrier liner located in at least a via portion of the combined via/line opening;
a first electrically conductive structure located on the diffusion barrier liner and present only in the via portion of the combined via/line opening, wherein the first electrically conductive structure comprises an alloy of a first metal or metal alloy having a first bulk resistivity and a second metal or metal alloy having a second bulk resistivity that is higher than the first bulk resistivity, wherein the first bulk resistivity is from 1.5 $\mu\Omega\cdot$cm to 3.0 $\mu\Omega\cdot$cm, the second bulk resistivity is from 3.5 $\mu\Omega\cdot$cm to 8.0 $\mu\Omega\cdot$cm, the first metal or metal alloy comprises copper (Cu), aluminum (Al), or a copper-aluminum (Cu—Al) alloy, and the second metal or metal alloy comprises cobalt (Co), ruthenium (Ru), rhodium (Rh), iridium (Ir), tungsten (W), nickel (Ni) or alloys thereof; and
a second electrically conductive structure present in at least a line portion of the combined via/line opening and located directly on the first electrically conductive structure, the second electrically conductive structure comprising another metal or metal alloy having either the first bulk resistivity or the second bulk resistivity.

10. The semiconductor structure of claim 9, wherein the second electrically conductive structure comprises the another metal or metal alloy having the first bulk resistivity.

11. The semiconductor structure of claim 9, wherein the second electrically conductive structure comprises the another metal or metal alloy having the second bulk resistivity.

12. The semiconductor structure of claim 9, wherein the diffusion barrier liner is present only in the via portion of the combined via/line opening.

13. A semiconductor structure comprising:
an interconnect level comprising an interconnect dielectric material layer having a combined via/line opening located therein;
a diffusion barrier liner located in at least a via portion of the combined via/line opening;

an alloy liner located on the diffusion barrier liner and present only in the via portion of the combined via/line opening, wherein the alloy liner comprises an alloy of a first metal or metal alloy having a first bulk resistivity and a second metal or metal alloy having a second bulk resistivity that is higher than the first bulk resistivity;

a first electrically conductive structure located on the alloy liner and present in at least the via portion of the combined via/line opening, wherein the first electrically conductive structure comprises the second metal or metal alloy having the second bulk resistivity; and a second electrically conductive structure present in at least a line portion of the combined via/line opening and located directly on the first electrically conductive structure.

14. The semiconductor structure of claim 13, wherein the first bulk resistivity is from 1.5 $\mu\Omega\cdot cm$ to 3.0$\mu\Omega\cdot cm$, and the second bulk resistivity is from 3.5 $\mu\Omega\cdot cm$ to 8.0 $\mu\Omega\cdot cm$.

15. The semiconductor structure of claim 14, wherein the first metal or metal alloy comprises copper (Cu), aluminum (Al), or a copper-aluminum (Cu—Al) alloy, and the second metal or metal alloy comprises cobalt (Co), ruthenium (Ru), rhodium (Rh), iridium (Ir), tungsten (W), nickel (Ni) or alloys thereof.

* * * * *